(12) United States Patent
Tokoi et al.

(10) Patent No.: US 9,635,791 B2
(45) Date of Patent: Apr. 25, 2017

(54) CARRIER TAPE, CARRIER TAPE MANUFACTURING APPARATUS, AND METHOD OF MANUFACTURING CARRIER TAPE

(75) Inventors: Shogo Tokoi, Kyoto-fu (JP); Yasuhiro Shimizu, Kyoto-fu (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 293 days.

(21) Appl. No.: 13/207,078

(22) Filed: Aug. 10, 2011

(65) Prior Publication Data

US 2012/0037538 A1 Feb. 16, 2012

(30) Foreign Application Priority Data

Aug. 11, 2010 (JP) .................... 2010-180139

(51) Int. Cl.
*B65D 85/00* (2006.01)
*H05K 13/00* (2006.01)
(52) U.S. Cl.
CPC ................. *H05K 13/0084* (2013.01)
(58) Field of Classification Search
CPC ............... H05K 13/0084; H01R 43/16
USPC ............. 206/714, 713, 725, 717, 715, 716
See application file for complete search history.

(56) References Cited

U.S. PATENT DOCUMENTS 3,200,719 A 8/1965 Welch
4,708,245 A * 11/1987 Boeckmann ........... B65D 73/02
206/714
4,966,282 A * 10/1990 Kawanishi et al. .......... 206/714
5,064,064 A * 11/1991 Itou ..................... B65D 73/02
206/714
5,390,472 A 2/1995 Weiler et al.
(Continued)

FOREIGN PATENT DOCUMENTS

CN 1142883 A 2/1997
CN 101249904 A 8/2008
(Continued)

OTHER PUBLICATIONS

Japanese Office Action "Notification of Reasons for Rejection" dated Oct. 2, 2012, which corresponds to Japanese Patent Application No. 2010-180139, and is related to U.S. Appl. No. 13/207,078 with translation.

(Continued)

*Primary Examiner* — Jacob K Ackun
*Assistant Examiner* — Jenine Pagan
(74) *Attorney, Agent, or Firm* — Studebaker & Brackett PC (57) ABSTRACT

Provided is a carrier tape with improved tensile strength and flexural rigidity in a longitudinal direction of a base material, including recesses that can be provided at a narrow pitch in a first surface of the base material, and manufacturable at reduced cost, as well as to provide an apparatus and a method for manufacturing such a carrier tape. A carrier tape of the present invention is constituted by a strip-shaped base material, and includes a plurality of recesses provided in a first surface of the base material and for containing electronic components, a covering unit configured to seal openings of the recesses, and a projection provided on a second surface of the base material along a longitudinal direction of the base material. A length of the projection extends over at least two of the recesses.

10 Claims, 10 Drawing Sheets

(56) References Cited

U.S. PATENT DOCUMENTS

| | | | |
|---|---|---|---|
| 5,524,765 A * | 6/1996 | Gutentag | H05K 13/0084 206/713 |
| 5,691,038 A * | 11/1997 | Hirata et al. | 428/194 |
| 6,547,076 B1 * | 4/2003 | Pylant | B65D 75/327 206/713 |
| 6,975,021 B1 * | 12/2005 | Dickey | H01L 21/6835 257/666 |
| 7,219,803 B2 * | 5/2007 | Thomas et al. | 206/714 |
| 7,828,152 B2 | 11/2010 | Hamanaka et al. | |
| 2003/0196930 A1 * | 10/2003 | Agari | 206/714 |
| 2004/0011701 A1 * | 1/2004 | Sumida et al. | 206/713 |
| 2004/0124119 A1 * | 7/2004 | Ahn et al. | 206/714 |
| 2006/0011508 A1 * | 1/2006 | Hoegerl | H05K 13/021 206/714 |
| 2007/0062845 A1 * | 3/2007 | Velasquez Urey et al. | 206/714 |
| 2007/0151213 A1 * | 7/2007 | Butler | H05K 13/0084 53/559 |
| 2008/0202981 A1 | 8/2008 | Hamanaka et al. | |

FOREIGN PATENT DOCUMENTS

| | | |
|---|---|---|
| DE | 10229377 A1 | 1/2004 |
| JP | S54-126574 U | 9/1979 |
| JP | S61-125983 U | 8/1986 |
| JP | H02-090266 U | 7/1990 |
| JP | H02-138168 U | 11/1990 |
| JP | H8-324678 A | 12/1996 |
| JP | 10-029662 A | 2/1998 |
| JP | 10-338208 A | 12/1998 |
| JP | H11-278581 A | 10/1999 |
| JP | 2001-348009 A | 12/2001 |
| JP | 2003-034357 A | 2/2003 |
| JP | 2006-273426 A | 10/2006 |
| JP | 2006273426 A * | 10/2006 |
| JP | 4142070 B2 | 8/2008 |
| KR | 10-1999-0072280 A | 9/1999 |
| KR | 10-2002-0062699 A | 7/2002 |

OTHER PUBLICATIONS

The Office Action issued by the Korean Intellectual Property Office on Jan. 31, 2013, which corresponds to Korean Patent Application No. 10-2011-0077173 and is related to U.S. Appl. No. 13/207,078 with English language summary.

The first Office Action issued by the State Intellectual Property Office of People's Republic of China on Jul. 1, 2013, which corresponds to Chinese Patent Application No. 201110261138.3 and is related to U.S. Appl. No. 13/207,078; with translation.

The Office Letter; "Preliminary Examination Report," issued by the Taiwan Intellectual Property Office (TIPO) on Apr. 11, 2014, which corresponds to Taiwanese Patent Application No. 100121949 and is related to U.S. Appl. No. 13/207,078.

The Office Letter; "Preliminary Examination Report," issued by the Taiwan Intellectual Property Office (TIPO) on Apr. 11, 2014, which corresponds to Taiwanese Patent Application No. 100121949 and is related to U.S. Appl. No. 13/207,078; with English language translation.

* cited by examiner

CARRIER TAPE, CARRIER TAPE MANUFACTURING APPARATUS, AND METHOD OF MANUFACTURING CARRIER TAPE

CROSS REFERENCE TO RELATED APPLICATIONS

The present application claims priority to Japanese Patent Application No. 2010-180139 filed Aug. 11, 2010, the entire contents of this application being incorporated herein by reference in its entirety.

FIELD OF THE INVENTION

The present invention relates to carrier tapes, carrier tape manufacturing apparatuses, and methods of manufacturing carrier tapes, and in particular, to a carrier tape including a plurality of recesses provided in one surface of a base material and for containing electronic components, as well as to an apparatus and a method for manufacturing such a carrier tape.

BACKGROUND

A typical apparatus for mounting an electronic component to a circuit board uses a carrier tape that contains electronic components to facilitate feeding of the electronic components. Japanese Unexamined Patent Application No. H10-029662 and Japanese Unexamined Patent Application No. H10-338208 each discloses a method of manufacturing a conventional carrier tape.

Figure 7:
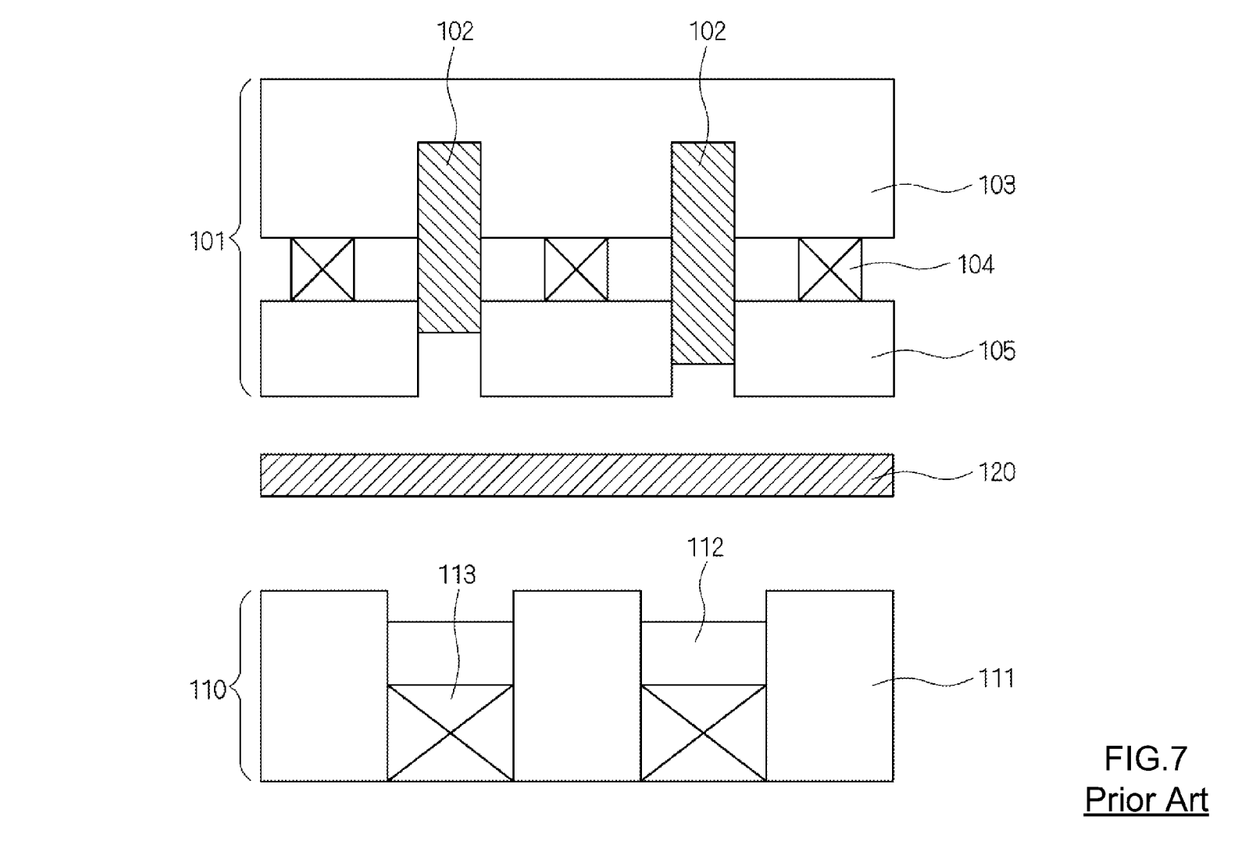
FIG. 7 is a cross-sectional view illustrating a cope and a drag of a carrier tape manufacturing apparatus.

Japanese Unexamined Patent Application No. H10-029662 discloses a method of manufacturing a carrier tape by compression molding of a strip-shaped base material between a cope having punches for providing a plurality of recesses for containing electronic components and a drag having bumpers at positions corresponding to the punches. FIG. 7 is a cross-sectional view illustrating a cope and a drag of a conventional carrier tape manufacturing apparatus. A cope 101 shown in FIG. 7 is provided with a plurality of punches 102, a punch holder 103 that holds the punches 102, and a stripper plate 105 that is coupled to the punch holder 103 with springs 104 interposed therebetween. A drag 110 is provided with a die plate 111, a plurality of bumpers 112 disposed at positions corresponding to the punches 102, and springs 113 that support the bumpers 112.

Figure 8:
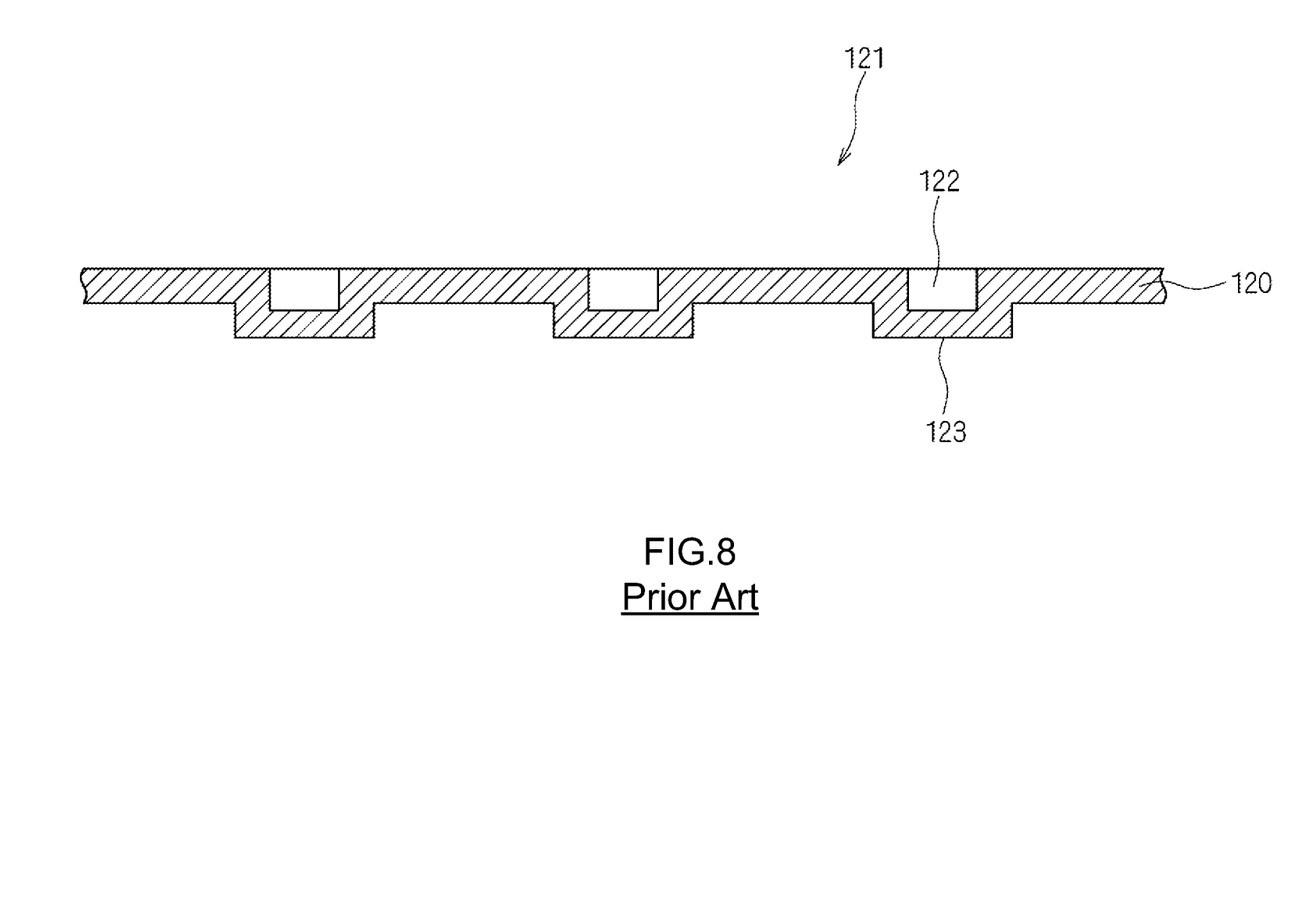
FIG. 8 is a cross-sectional view of a carrier tape that has been manufactured by performing compression molding to the base material between the cope and the drag of the conventional method.

By performing compression molding to a strip-shaped base material 120 between the cope 101 and the drag 110, it is possible to manufacture a carrier tape having a plurality of recesses for containing electronic components. FIG. 8 is a cross-sectional view of a carrier tape that has been manufactured by performing compression molding to the base material 120 between the cope 101 and the drag 110 of the conventional method. A carrier tape 121 shown in FIG. 8 includes a plurality of recesses 122 provided in one surface (front surface) of the base material 120 and for containing electronic components, and projections 123 provided on the other surface (back surface) of the base material 120. The projections 123 are formed by embedding a portion of the base material 120 into each bumper 112 when the recesses 122 are provided by the punches 102. Accordingly, the carrier tape 121 has the projections 123 on the back surface of the base material 120 respectively corresponding to the recesses 122 in the front surface of the base material 120.

Figure 9:
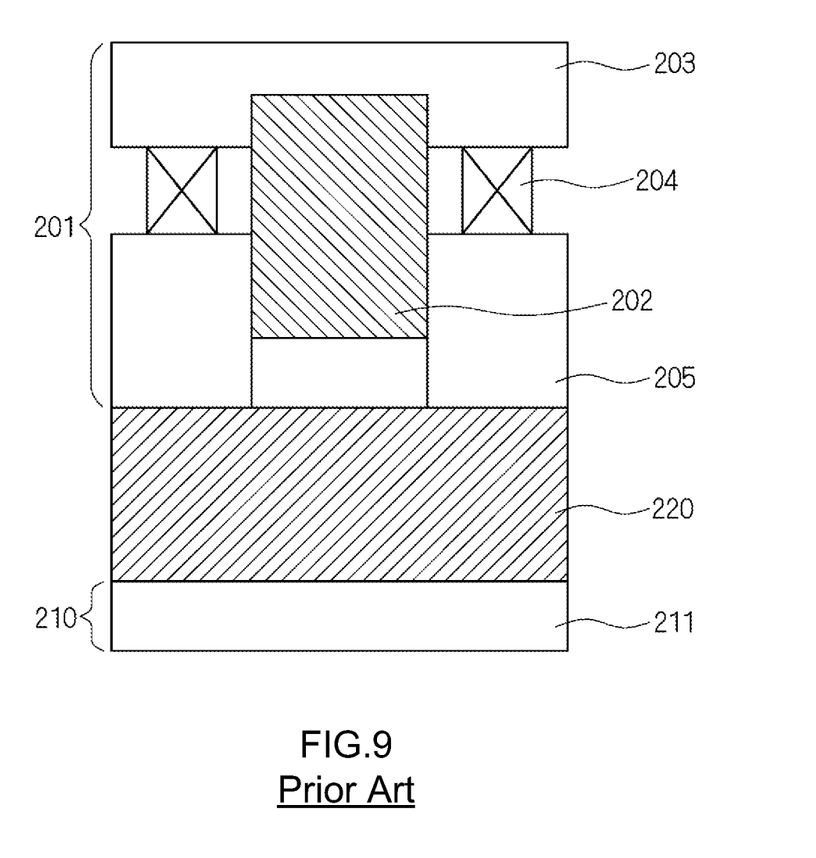
FIG. 9 is a cross-sectional view illustrating a cope and a drag of a carrier tape manufacturing apparatus.

Japanese Unexamined Patent Application No. H10-338208 discloses a method of manufacturing a carrier tape by compression molding of a strip-shaped base material between a cope and a drag, the cope having punches for providing a plurality of recesses for containing electronic components. FIG. 9 is a cross-sectional view illustrating a cope and a drag of a conventional carrier tape manufacturing apparatus. A cope 201 shown in FIG. 9 is provided with a punch 202, a punch holder 203 that holds the punch 202, and a stripper plate 205 that is coupled to the punch holder 203 with springs 204 interposed therebetween. A drag 210 is provided with a die plate 211 whose plane on which a base material 220 is placed is constituted by a single flat surface. Although not depicted, the cope 201 is provided with a plurality of punches 202, and the plurality of punches 202 are held in parallel by the punch holder 203.

Figure 10:
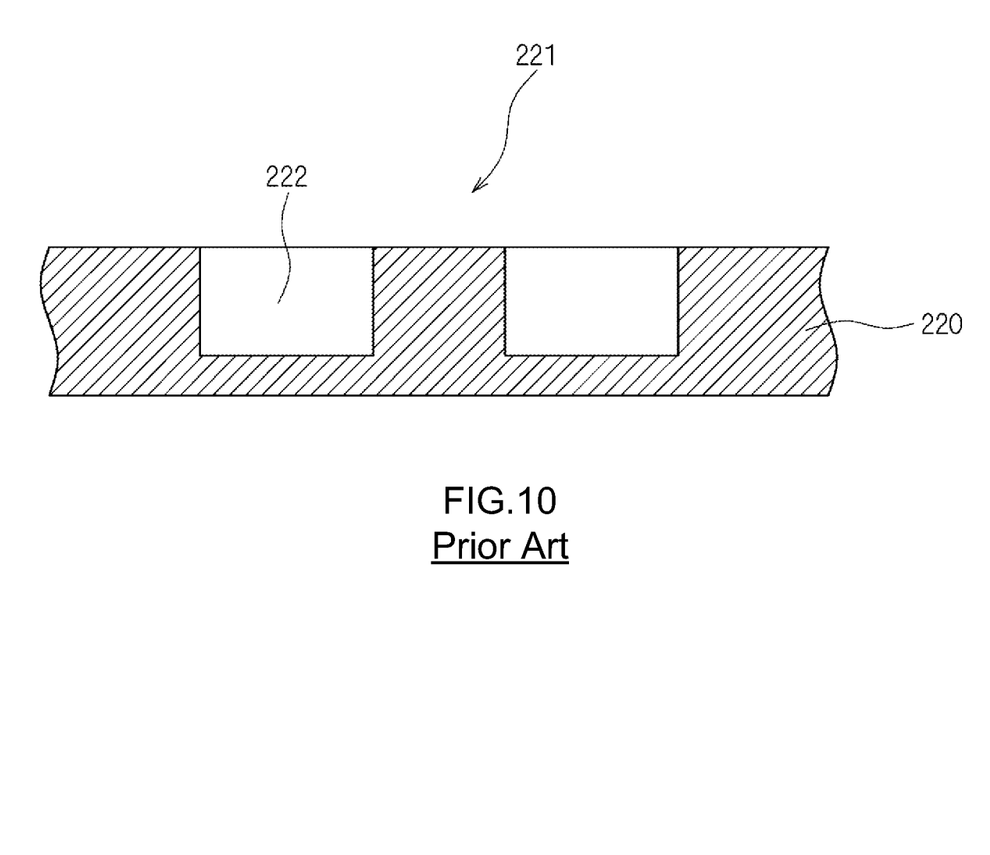
FIG. 10 is a cross-sectional view of a carrier tape that has been manufactured by performing compression molding to the base material between the cope and the drag of the conventional method.

By performing compression molding to the base material 220 between the cope 201 and the drag 210, it is possible to manufacture a carrier tape having a plurality of recesses for containing electronic components. FIG. 10 is a cross-sectional view of a carrier tape that has been manufactured by performing compression molding to the base material 220 between the cope 201 and the drag 210 of the conventional method. A carrier tape 221 shown in FIG. 10 includes a plurality of recesses 222 provided in one surface (front surface) of the base material 220 and for containing electronic components. Being supported by the die plate 211 constituted by a single flat surface, the other surface (back surface) of the base material 220 remains flat even after the recesses 222 have been provided in the front surface of the base material 220.

SUMMARY

The present disclosure provides a carrier tape with improved tensile strength and flexural rigidity in a longitudinal direction of a base material, including recesses that can be provided at a narrow pitch in one surface of the base material, and manufacturable at reduced cost, as well as to provide an apparatus and a method for manufacturing such a carrier tape.

In one aspect, the disclosure provides a carrier tape constituted by a strip-shaped base material, where the tape includes a plurality of recesses provided in a first surface of the base material and for respectively containing electronic components. A covering unit is configured to seal openings of the recesses. A projection is provided on a second surface of the base material along a longitudinal direction of the base material, where a length of the projection is such that the projection extends over at least two of the recesses.

In a more specific aspect, the projection is provided along an entire length of the base material in the longitudinal direction of the base material.

In another more specific aspect, the projection is provided on the second surface of the base material at a position immediately under the recesses.

In yet another more specific aspect, in a direction perpendicular to the longitudinal direction of the base material, a width of the projection is greater than that of the recesses.

In another more specific aspect, a depth of the recesses is such that each recess reaches down to a position of the projection provided on the second surface of the base material.

In still another more specific aspect, the base material is made of paper.

In another aspect of the present disclosure, a carrier tape manufacturing apparatus includes a first mold having punches that provide a plurality of recesses in a first surface of a strip-shaped base material, where the recesses are for respectively containing electronic components. A second mold is configured to be fitted with the first mold and has a groove that provides a projection on a second surface of the base material along a longitudinal direction of the base material. A length of the projection is such that the projection extends over at least two of the recesses, and the base material is subjected to compression molding between the first mold and the second mold.

In another aspect of the present disclosure, a method of manufacturing a carrier tape by performing compression molding to a strip-shaped base material between a first mold and a second mold includes providing a plurality of recesses in a first surface of the base material by compression using punches included in the first mold, the recesses being for respectively containing electronic components, and embedding a portion of the base material compressed by the punches into a groove included in the second mold. In this way, a projection is provided on a second surface of the base material along a longitudinal direction of the base material, a length of the projection being such that the projection extends over at least two of the recesses.

Other features, elements, and characteristics, and advantages will become more apparent from the following detailed description with reference to the attached drawings.

BRIEF DESCRIPTION OF THE DRAWINGS

FIG. 1A to FIG. 1C illustrate a carrier tape according to an exemplary embodiment, in which

FIG. 3A and FIG. 3B illustrate the drag of the carrier tape manufacturing apparatus that is used for manufacturing the carrier tape according to the exemplary embodiment, in which

FIG. 6A to FIG. 6C illustrate a carrier tape of a different configuration according to the exemplary embodiment, in which

DETAILED DESCRIPTION

According to the manufacturing method disclosed in Japanese Unexamined Patent Application No. H10-029662, in order to provide the projections 123 on the back surface of the base material 120 so as to respectively correspond to the recesses 122 provided in the front surface of the base material 120, it is necessary to use the drag 110 having the bumpers 112 at positions corresponding to the punches 102. In addition, in order to decrease the pitch between the plurality of recesses 122 provided in the front surface of the base material 120, it is necessary to make a rib separating the bumpers 112 thin. However, the inventors realized that there is a problem that an extent to which the rib separating the bumpers 112 can be made thin is limited in order to maintain the strength of the drag 110, and therefore it is adversely difficult to provide the recesses 122 at a narrow pitch. Moreover, since the drag 110 disclosed in Japanese Unexamined Patent Application No. H10-029662 is required to have the bumpers 112, the springs 113, and the like, there is another problem that the production cost including the cost for a carrier tape manufacturing apparatus increases.

Further, according to the manufacturing method disclosed in Japanese Unexamined Patent Application No. H10-029662, when providing the recesses 122 in the front surface of the base material 120, a portion of the base material 120 is embedded into each bumper 112. The inventors also appreciated that the base material 120 embedded in the bumpers 112 needs to be lifted up in order to transfer the base material 120 embedded in the bumpers 112, and that therefore there exists a problem that the production cost increases since a number of manufacturing steps cannot be reduced. In addition, since the projections 123 are provided on the back surface of the base material 120, there is a problem that dusts are produced when transferring the base material 120 due to a friction between the projections 123 and an edge of the drag 110.

Moreover, the carrier tape 221 disclosed in Japanese Unexamined Patent Application No. H10-338208, the thickness of the base material 220 immediately under the recesses 222 is thinner than the thickness of the base material 220 other than these portions, tensile strength and flexural rigidity in a longitudinal direction of the base material 220 decreases. Further, since the back surface of the base material 220 remains flat even after the recesses 222 have been provided, the depth of the recesses 222 in the front surface of the base material 220 is restricted within the thickness of the base material 220. In addition, since the drag 210 disclosed in Japanese Unexamined Patent Application No. H10-338208 is provided with the die plate 211 whose plane on which the base material 220 is placed is constituted by a single flat surface, there is a problem of possible destruction of the punches 202 as the punches 202 are overloaded due to over-compression of the base material 220 at bottom surfaces of the recesses 222 when providing the recesses 222 using the punches 202.

A preferred embodiment of the present invention that can address the above-described problems will be now described in detail with reference to the drawings.

Figure 1A:
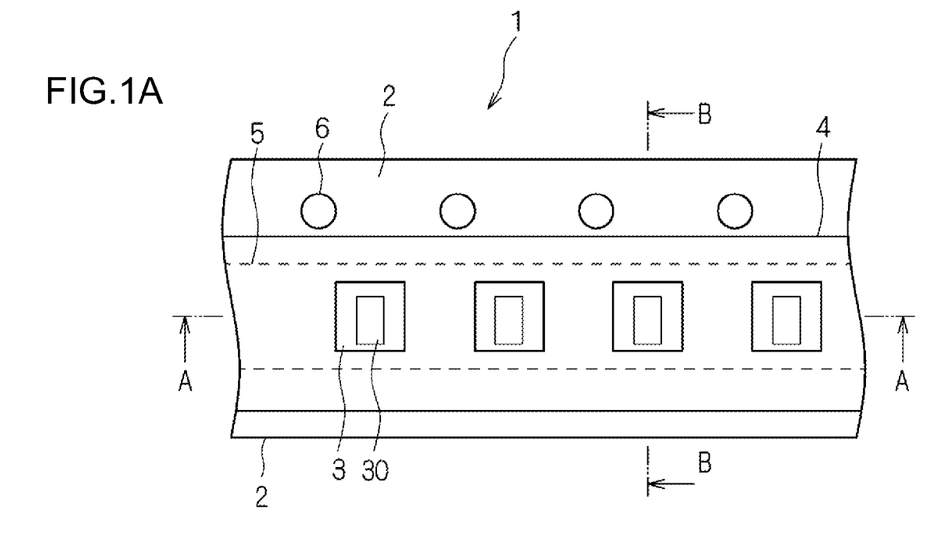
FIG. 1A is a front elevational view.
Figure 1B:
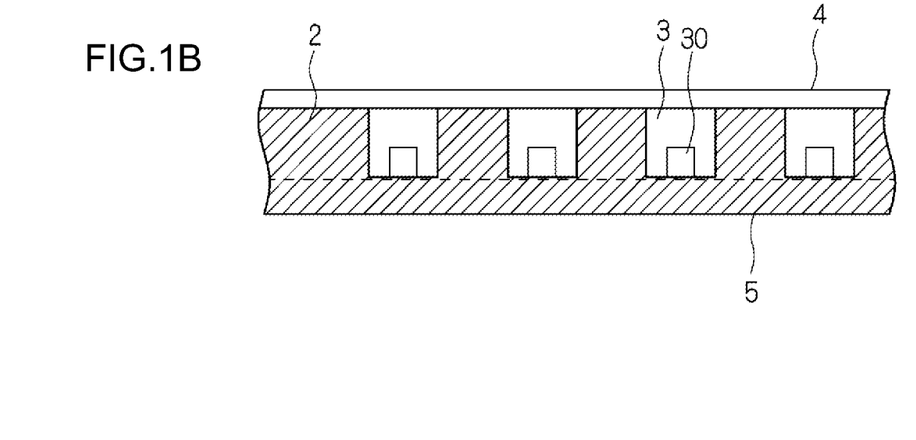
FIG. 1B and FIG. 1C are cross-sectional views.
Figure 1C:
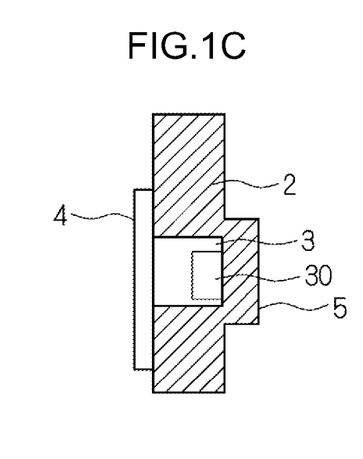

FIG. 1A to FIG. 1C illustrate a carrier tape according to an exemplary embodiment, in which FIG. 1A is a front elevational view, and FIG. 1B and FIG. 1C are cross-sectional views. FIG. 1A is a front elevational view of a carrier tape 1, FIG. 1B is a cross-sectional view taken along line A-A of the carrier tape 1, and FIG. 1C is a cross-sectional view taken along line B-B of the carrier tape 1. The carrier tape 1 is constituted by a strip-shaped base material 2, and includes a plurality of recesses 3 provided in a front surface (one surface) of the base material 2 and for containing electronic components 30, a covering unit 4 configured to seal openings of the recesses 3, and a projection 5 provided on the other surface of the base material 2 along a longitudinal direction of the base material 2, a length of the projection 5 being such that the projection 5 extends over at least two of the recesses 3. It is to be noted that the carrier tape 1 includes pilot holes 6 provided in the base material 2 running parallel to the recesses 3, and that an apparatus for mounting electronic components to a circuit board uses the pilot holes 6 to sequentially supply the electronic components 30 contained in the recesses 3.

An example of the dimensions of the carrier tape 1 will now be described. The base material 2 is 8 mm in width and 0.6 mm in thickness, each recess 3 is 0.59 mm in length (i.e., the length along the longitudinal direction of the base material 2), 1.10 mm in width (i.e., the length along a direction perpendicular to the longitudinal direction of the base material 2), and 0.57 mm in depth, a pitch between the plurality of adjacent recesses 3 is 1.0 mm, and the projection 5 is 2.5 mm in width (i.e., the length along the direction perpendicular to the longitudinal direction of the base material 2), and 0.14 mm in thickness. Each of the electronic components 30 contained in the recesses 3 is 0.5 mm in length, 1.0 mm in width, and 0.5 mm in height.

The carrier tape 1 is continuous from right to left in FIG. 1A, and normally held in a state of being wound around a reel and the like. The base material 2 can be made of any of a paperboard, resin, and a compound material of paper and resin, for example. Each recess 3 is a portion in which a small component such as an electronic component or a precision component, for example, a chip capacitor, is contained. The covering unit 4 can be, for example, a laminated film constituted by two layers of a polyester layer and a polyethylene layer. In such a case, the covering unit 4 can seal the openings of the recesses 3 by performing thermocompression bonding of the polyethylene layer to the base material 2.

The projection 5 is provided along an entire length of the base material 2 in the longitudinal direction on the back surface of the base material 2. By providing the projection 5, it is possible to increase the thickness of portions of the base material 2 immediately below the recesses 3 by the thickness of the projection 5, as well as to provide a rib structure on the back surface of the base material 2. Accordingly, providing the projection 5 can improve tensile strength and flexural rigidity of the carrier tape 1 in the longitudinal direction of the base material 2. It should be noted that the thickness of portions of the base material 2 immediately below the recesses 3 and the thickness of the projection 5 (an amount of projection) can be designed appropriately depending on the depth of the recesses 3 and the width of the projection 5.

Figure 2:
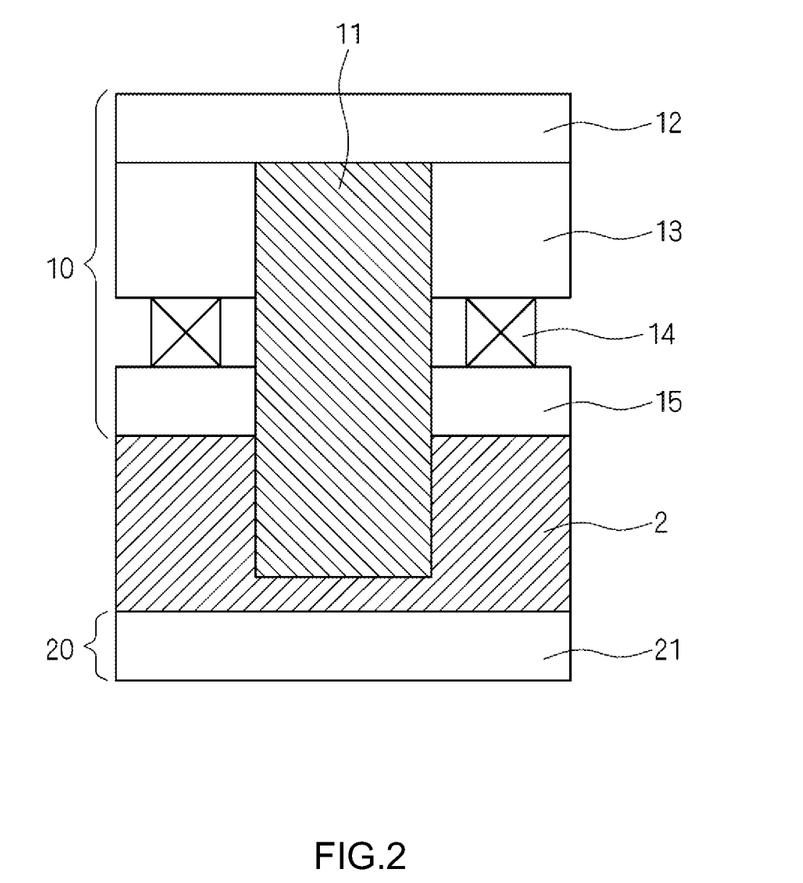
FIG. 2 is a cross-sectional view illustrating a cope (first mold) and a drag (second mold) of a carrier tape manufacturing apparatus that is used for manufacturing the carrier tape according to the exemplary embodiment.

Next, an exemplary method of manufacturing the carrier tape 1 will be described. FIG. 2 is a cross-sectional view illustrating a cope (first mold) and a drag (second mold) of a carrier tape manufacturing apparatus that is used for manufacturing the carrier tape 1 according to the exemplary embodiment. A cope 10 shown in FIG. 2 is provided with a punch 11, a punch holder 12 and a punch plate 13 that hold the punch 11, and a stripper plate 15 coupled to the punch plate 13 with springs 14 interposed therebetween. The stripper plate 15 holds the base material 2 such that the base material 2 may not move when pulling the punch 11 out of the base material 2 after compressing the base material 2 by the punch 11. The drag 20 is provided with a die plate 21 on which the base material 2 is placed. Here, the punch 11 and the die plate 21 are made of a material such as cemented carbide, for example. Further, although not shown, the cope 10 includes a plurality of punches 11, and the plurality of punches 11 are held in parallel by the punch holder 12 and the punch plate 13.

Figure 3A:
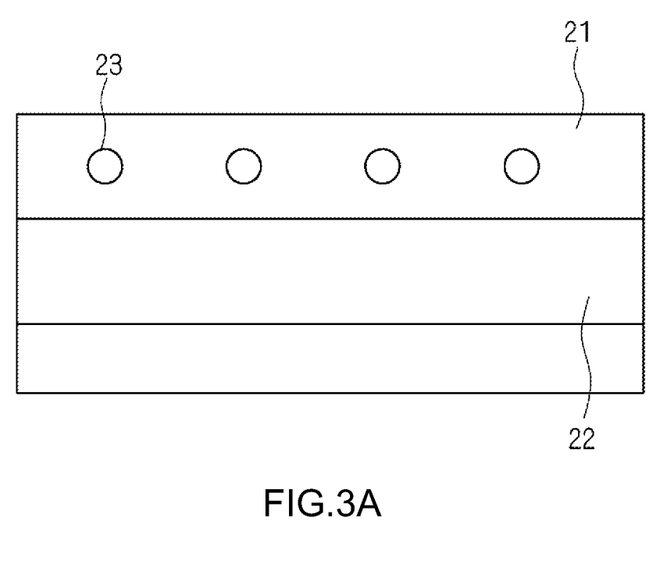
FIG. 3A is a front elevational view and FIG. 3B is a side elevational view.
Figure 3B:
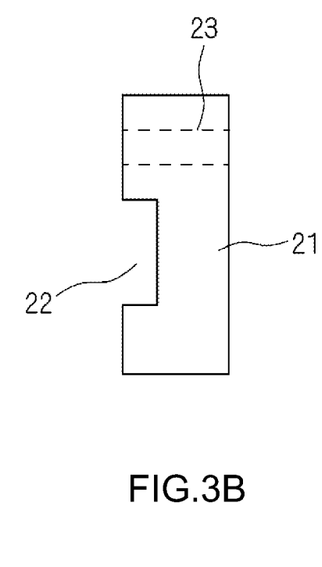

FIG. 3A and FIG. 3B illustrate the drag 20 of the carrier tape manufacturing apparatus that is used for manufacturing the carrier tape 1 according to the embodiment of the present invention, in which FIG. 3A is a front elevational view and FIG. 3B is a side elevational view. A drag 20 shown in FIGS. 3A and 3B includes a groove 22 in a surface of the die plate 21 on which the base material 2 is placed, and pilot hole cast holes 23. The groove 22 is provided in parallel to the longitudinal direction of the base material 2, and continuously from one end to the other end of the die plate 21 along an entire length of the base material 2 in the longitudinal direction at a portion including positions at which the punches 11 of the cope 10 compress the base material 2. The pilot hole cast holes 23 are provided in the die plate 21 at an equal interval in parallel to the groove 22. It is to be noted that although not shown in FIG. 2, the cope 10 includes the punches at positions corresponding to the positions of the pilot hole cast holes 23, and the punches are held by the punch holder 12 and the punch plate 13. The drag 20 has a simple structure and does not need a bumper or a spring, and therefore it is possible to reduce the cost of the carrier tape manufacturing apparatus.

First, the carrier tape manufacturing apparatus supplies the base material 2 between the cope 10 and the drag 20, and places the base material 2 at a predetermined position of the drag 20. Then, as shown in FIG. 2, the carrier tape manufacturing apparatus causes the cope 10 and the drag 20 to fit with each other to compress the base material 2 by the punches 11. By compressing the base material 2 by the punches 11, the recesses 3 are provided in the front surface of the base material 2, and a portion of the base material 2 is embedded into the groove 22 of the die plate 21 when the recesses 3 are provided, thereby providing the projection 5 on the back surface of the base material 2. Accordingly, the shapes of the recesses 3 and the projection 5 are stable, and it is possible to manufacture the carrier tape 1 whose dimensions are uniform.

Figure 4:
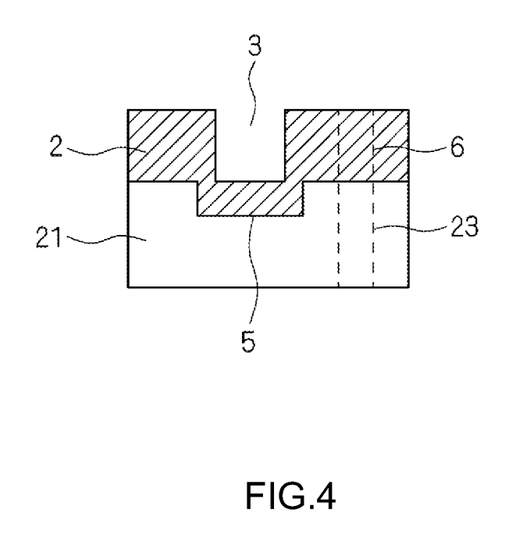
FIG. 4 is a cross-sectional view of a die plate and a base material after the base material has been compressed by a punch.

FIG. 4 is a cross-sectional view of the die plate 21 and the base material 2 after the base material 2 has been compressed by the punches 11. Referring to FIG. 4, the recesses 3 are provided in the front surface of the base material 2, and the projection 5 is provided on the back surface of the base material 2. Specifically, in this example, a bottom surface of each punch 11 is 0.59 mm in length (i.e., the length along the longitudinal direction of the base material 2), and 1.10 mm in width (i.e., the length along the direction perpendicular to the longitudinal direction of the base material 2), and the recesses 3 are provided by compressing the base material 2 from the front surface to the back surface by 0.57 mm using the punches 11. On the other hand, the groove 22 is 2.5 mm in width (i.e., the length along the direction perpendicular to the longitudinal direction of the base material 2), and 0.14 mm in depth, and the projection 5 is provided by embedding the portion of the base material 2 into the groove 22.

Figure 5:
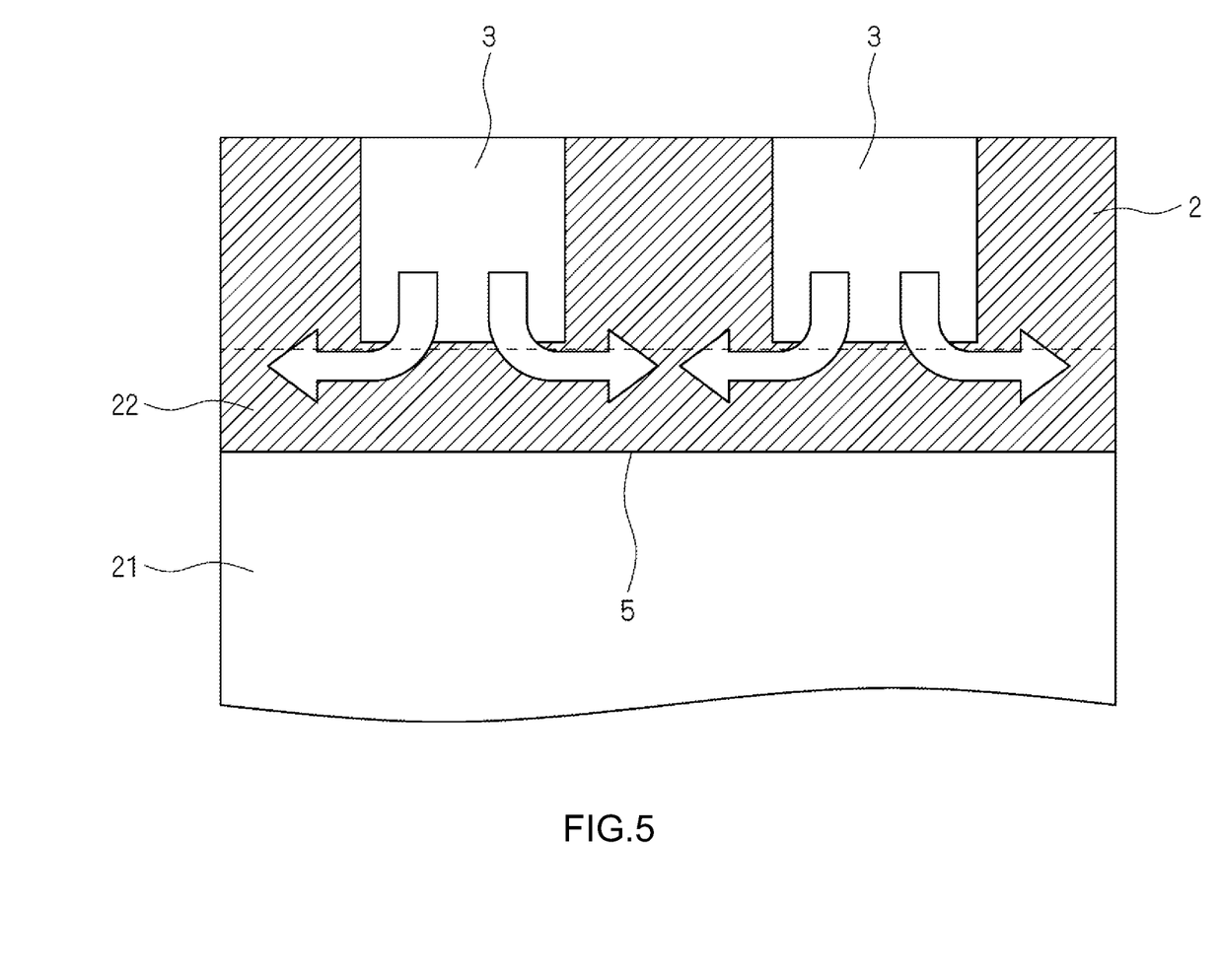
FIG. 5 is a schematic view illustrating how a portion of the compressed base material is embedded into a groove.

As described above, by compressing the base material 2 by the punches 11, the portion of the compressed base material 2 is embedded into the groove 22. FIG. 5 is a schematic view illustrating how the portion of the compressed base material 2 is embedded into the groove 22. Referring to FIG. 5, as the portion of the base material 2 compressed by the punches 11 is embedded into the groove 22, as shown by arrows, the groove 22 can be utilized as an escaping space for the base material 2 compressed by the punches 11. By using the groove 22 as the escaping space for the compressed base material 2, it is possible to provide the projection 5 by the portion of the base material 2 compressed by the punches 11, thereby preventing the base material 2 from being overly compressed at the bottom surfaces of the recesses 3. Accordingly, it is possible to reduce the load applied to the punches 11 themselves, thereby reducing the possibility of destruction of the punches 11. Further, since providing the groove 22 also reduces the force generated when the adjacent punches 11 compress the base material 2, the pitch between the punches 11 can be made narrower than a pitch between the punches of the conventional example (e.g., 2 mm), and thus it is possible to provide the recesses 3 at a narrow pitch (e.g., 1 mm) in the front surface of the base material 2. When the base material 2 is made of paper, by providing the projection 5 on the back surface of the base material 2 and preventing the base material 2 from being overly compressed at the bottom surfaces of the recesses 3, it is possible to make density variations of the paper relatively small between the bottom surfaces of the recesses 3 and portions other than the bottom surfaces of the recesses 3, thereby reducing a chronological change in the base material 2 due to moisture absorption and the like.

Moreover, according to the manufacturing method disclosed in Japanese Unexamined Patent Application No. H10-338208, as the back surface of the base material 220 is flat, the depth of the recesses 222 provided in the front surface of the base material 220 is required to be restricted within the thickness of the base material 220. However, according to the method of manufacturing the carrier tape 1 of the exemplary embodiment, by making the width of the groove 22 (e.g., 2.5 mm) to be greater than or equal to the width of the bottom surfaces of the punches 11 (e.g., 1.10 mm), the punches 11 can compress the base material 2 down to a position of the groove 22. Accordingly, it is possible to manufacture the carrier tape 1 in which the depth of the recesses 3 is such that each recess 3 reaches down to a position of the projection 5 provided on the back surface of the base material 2. More specifically, according to the carrier tape 1, it is possible to make the depth of the recesses 3 to be greater than the thickness of the base material 2. Therefore, the base material 2 prepared prior to processing can be made as thin as possible.

Furthermore, because the groove 22 is provided at the portion corresponding to the positions at which the punches 11 compress the base material 2, it is possible to provide the projection 5 on the back surface of the base material 2 at the position immediately under the recesses 3. By providing the projection 5 on the back surface of the base material 2 at the position immediately under the recesses 3, it is possible to use the portion of the base material 2 compressed by the punches 11 to provide the projection 5, thereby preventing the base material 2 from being overly compressed at the bottom surfaces of the recesses 3. Accordingly, it is possible to reduce the load applied to the punches 11 themselves, thereby reducing the possibility of destruction of the punches 11. In addition, since the thickness of the base material 2 immediately under the recesses 3 becomes thicker by the thickness of the projection 5, it is possible to improve the tensile strength and the flexural rigidity in the longitudinal direction of the base material 2.

Further, by making the width of the groove 22 to be greater than the width of the bottom surfaces of the punches 11, it is possible to manufacture the carrier tape 1 in which the width of the projection 5 (i.e., the length along the direction perpendicular to the longitudinal direction of the base material 2) is greater than the width of the recesses 3 (i.e., the length along the direction perpendicular to the longitudinal direction of the base material 2). Because the width of the projection 5 is greater than the width of the recesses 3, a larger portion of the base material 2 compressed by the punches 11 can be used for providing the projection 5, thereby further preventing the base material 2 from being overly compressed at the bottom surfaces of the recesses. Accordingly, it is possible to reduce the load applied to the punches 11 themselves, thereby reducing the possibility of destruction of the punches 11. In addition, because the dimensions of the groove 22 are determined considering a volume of the portion of the base material 2 to be embedded into the groove 22 by the compression of the punches 11, the width of the groove 22 can be smaller than the width of the bottom surface of the punch 11, and the width of the projection 5 of the manufactured carrier tape 1 can be smaller than the width of the recesses 3.

Next, the cope 10 and the drag 20 are fitted with each other, the base material 2 is compressed by the punches 11 to provide the recesses 3 and the projection 5, and the base material 2 provided with the pilot holes 6 is wound around a reel. When winding the base material 2 around the reel, it is necessary to transfer the base material 2 placed on the drag 20. The groove 22 is provided continuously from the one end to the other end of the die plate 21 along an entire length of the base material 2 in the longitudinal direction, as shown in FIG. 3, and there is no blocking portion when transferring the base material 2 in the longitudinal direction of the base material. Accordingly, when winding the base material 2 around the reel, the base material 2 can be transferred smoothly in the longitudinal direction of the base material 2 without lifting up the base material 2 embedded into the groove 22, and therefore it is possible to reduce a number of manufacturing steps as well as the manufacturing cost. In addition, since it is not necessary to provide the drag 20 with edges in the longitudinal direction of the base material 2, dusts may not be produced when transferring the base material 2 due to a friction between the base material 2 and edges of the drag 20.

Next, the electronic components 30 are contained in the recesses 3 provided in the base material 2 wound around the reel. Then, the openings of the recesses 3 that contain the electronic components 30 are sealed by the covering unit 4. The base material 2 in which the openings of the recesses 3 are sealed by the covering unit 4 is wound around a different reel, and whereby the manufacturing of the carrier tape 1 is completed.

As described above, the carrier tape 1 according to the exemplary embodiment includes: the plurality of recesses 3 provided in the front surface of the base material 2 and for containing the electronic components 30; the covering unit 4 configured to seal openings of the recesses 3; and the projection 5 provided on the back surface of the base material 2 along the longitudinal direction of the base material 2, the length of the projection 5 being such that the projection 5 extends over at least two of the recesses 3. Therefore, it is possible to provide the rib structure on the back surface of the base material 2, and to improve the tensile strength and the flexural rigidity in the longitudinal direction of the base material 2. In addition, the projection 5 on the back surface of the base material 2 is not required to be provided to correspond to each of the recesses 3 in the front surface of the base material 2, and it is not necessary to use a drag including bumpers at positions corresponding to the punches 11 for providing the recesses 3. Accordingly, the recesses 3 can be provided at a narrow pitch without considering the thickness of a rib for separating the bumpers.

Further, according to the carrier tape 1 of the exemplary embodiment, the projection 5 is provided along an entire length of the base material 2 in the longitudinal direction on the back surface of the base material 2. Therefore, recesses and projections are not present on the back surface of the base material 2 in the longitudinal direction of the base material 2, as in the case of the conventional carrier tape 121 shown in FIG. 8. Accordingly, an oscillation of the carrier tape 1 may not occur even if an apparatus that mounts the electronic components 30 to the circuit board is configured to transfer the carrier tape 1 while guiding the back surface of the base material 2 using a plate spring or the like, and therefore it is possible to reduce generation of errors such as not being able to pick up the electronic component 30.

Figure 6A:
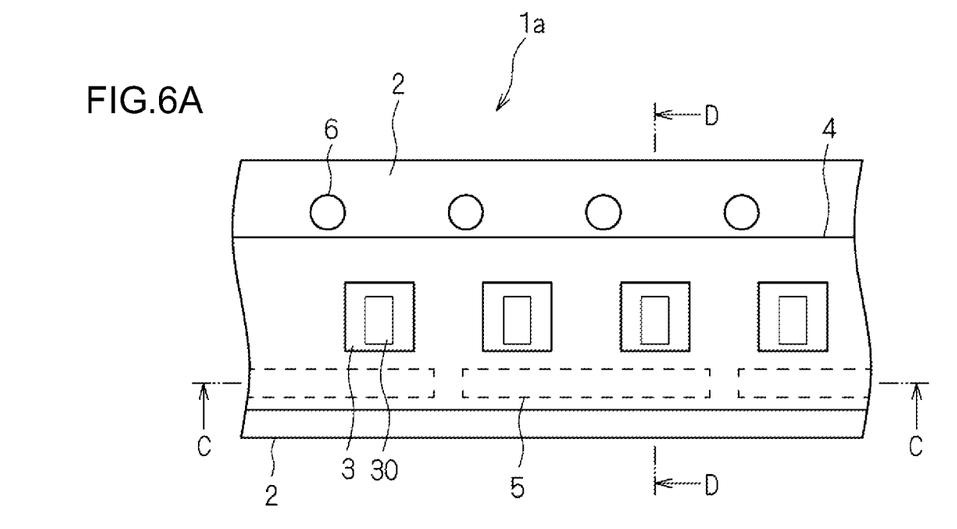
FIG. 6A is a front elevational view.
Figure 6B:
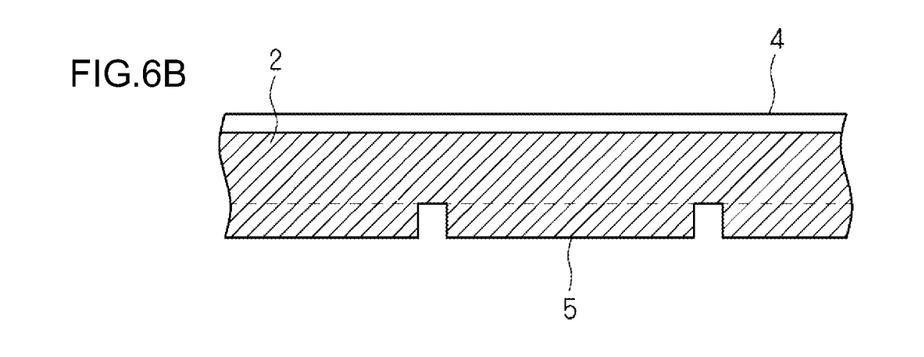
FIG. 6B and FIG. 6C are cross-sectional views.
Figure 6C:
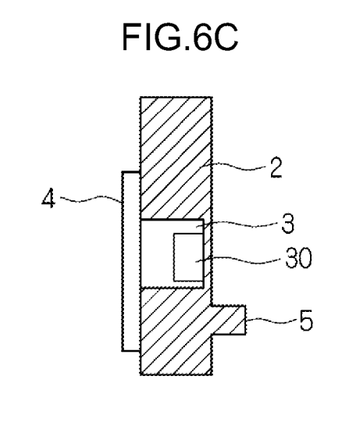

Moreover, according to the carrier tape 1 of the exemplary embodiment, the projection 5 is provided along an entire length of the base material 2 in the longitudinal direction. However, if it is possible to provide the rib structure on the back surface of the base material 2 and to improve the tensile strength and the flexural rigidity in the longitudinal direction of the base material 2, the projection 5 whose length is such that the projection 5 extends over at least two of the recesses 3 can be provided on the back surface of the base material 2. FIG. 6A to FIG. 6C illustrate a carrier tape of a different configuration according to the exemplary embodiment, in which FIG. 6A is a front elevational view, and FIG. 6B and FIG. 6C are cross-sectional views. FIG. 6A is a front elevational view of a carrier tape 1a, FIG. 6B is a cross-sectional view taken along line C-C of the carrier tape 1a, and FIG. 6C is a cross-sectional view taken along line D-D of the carrier tape 1a. As shown in FIG. 6B, according to the carrier tape 1a, the projection 5 whose length is such that the projection 5 extends over at least two of the recesses 3 is provided on the back surface of the base material 2.

Furthermore, according to the carrier tape 1 shown in FIG. 1, the projection 5 is provided on the back surface of the base material 2 at the position immediately under the recesses 3. However, if it is possible to provide the rib structure on the back surface of the base material 2 and to improve the tensile strength and the flexural rigidity in the longitudinal direction of the base material 2, the projection 5 is not required to be provided on the back surface of the base material 2 at the position immediately under the recesses 3. As shown in FIG. 6C, according to the carrier tape 1a, the projection 5 is provided on the back surface of the base material 2 at a position other than the position immediately under the recesses 3.

Further, the carrier tape manufacturing apparatus according to the exemplary embodiment includes the cope 10 having the punches 11 for providing the front surface of the base material 2 with the plurality of recesses 3 for containing the electronic components 30, and the drag 20 having the groove 22 for providing the projection 5 on the back surface of the base material 2 along the entire length of the base material 2 in the longitudinal direction. Therefore, the thickness of the base material 2 immediately under the recesses 3 can be made thicker by the thickness of the projection 5, the back surface of the base material 2 can be provided with the rib structure, and whereby it is possible to manufacture the carrier tape 1 with improved tensile strength and flexural rigidity in the longitudinal direction of the base material 2.

Moreover, the method of manufacturing the carrier tape 1 according to the exemplary embodiment includes the steps of providing the plurality of recesses 3 in the front surface of the strip-shaped base material 2 for containing the electronic components 30 using the punches 11 provided for the cope 10 by compression, embedding the portion of the base material 2 compressed by the punches 11 into the groove 22 provided in the drag 20, and providing the projection 5 on the back surface of the base material 2 along the entire length of the base material 2 in the longitudinal direction. Therefore, the thickness of the base material 2 immediately under the recesses 3 can be made thicker by the thickness of the projection 5, the back surface of the base material 2 can be provided with the rib structure, and whereby it is possible to manufacture the carrier tape 1 with improved tensile strength and flexural rigidity in the longitudinal direction of the base material 2.

When providing the recesses 3 using the punches 11 provided for the cope 10, the portion of the base material 2 compressed by the punches 11 is embedded into the groove 22 provided in the drag 20, and therefore it is possible to evenly distribute the material of the base material 2 that constitutes the bottom surfaces of the recesses 3. Accordingly, when the electronic components 30 contained in the recesses 3 are inspected using a transmission sensor or the like through the bottom surfaces of the recesses 3 (i.e., the back surface of the base material 2), it is possible to reduce the occurrence of false detection without being blocked by the base material 2.

With embodiments consistent with the disclosure, it is possible to provide a rib structure on a surface of the base material, and to improve the tensile strength and the flexural rigidity in the longitudinal direction of the base material. In addition, projections on the surface of the base material are not required to be provided to correspond to each of the recesses provided in the one surface of the base material, and therefore it is not necessary to use a mold including bumpers at positions corresponding to the punches for providing the recesses. Accordingly, the plurality of recesses can be provided at a narrow pitch without considering the thickness of a rib for separating the bumpers.

With the projection provided along an entire length of the base material in the longitudinal direction, the base material can be transferred in the longitudinal direction of the base material without lifting up the base material, and it is possible to reduce a number of manufacturing steps as well as the manufacturing cost. In addition, since it is not necessary to provide the mold used for manufacturing the carrier tape with edges in the longitudinal direction of the base material, dusts may not be produced when transferring the base material due to a friction between the base material and edges of the mold.

Additionally, with the projection provided on a surface of the base material at the position immediately under the recesses, it is possible to use the portion of the base material compressed by the punches to provide the projection, thereby preventing the base material from being overly compressed at the bottom surfaces of the recesses. Accordingly, it is possible to reduce the load applied to the punches themselves, thereby reducing the possibility of destruction of the punches. In addition, as the thickness of the base material immediately under the recesses becomes thicker by the thickness of the projection, it is possible to improve the tensile strength and the flexural rigidity in the longitudinal direction of the base material.

Also, in the direction perpendicular to the longitudinal direction of the base material, in some embodiments the width of the projection can be made greater than that of the recesses. Therefore, a larger portion of the base material compressed by the punches can be used for providing the projection, thereby further preventing the base material from being overly compressed at the bottom surfaces of the recesses. Accordingly, it is possible to reduce the load applied to the punches themselves, thereby reducing the possibility of destruction of the punches.

In embodiments where the depth of the recesses is such that each recess reaches down to the position of the projection provided on the other surface of the base material, it is possible to make the depth of the recesses provided in the one surface of the base material to be greater than or equal to the thickness of the base material.

According to embodiment in which the base material is made of paper, by providing the projection on the other surface of the base material and by preventing the base material from being overly compressed at the bottom surfaces of the recesses, it is possible to make density variations of the paper relatively small between the bottom surfaces of the recesses and portions other than the bottom surfaces of the recesses, thereby reducing a chronological change in the base material due to moisture absorption and the like.

In a manufacturing apparatus according to an embodiment of the disclosure, a first mold has the punches that provide the recesses in the first surface of the base material, the recesses being for respectively containing the electronic components, and the second mold having the groove that provides the projection on the second surface of the base material along the longitudinal direction of the base material, where the length of the projection is such that the projection extends over at least two of the recesses. Therefore, it is possible to provide the rib structure on the second surface of the base material, and to improve the tensile strength and the flexural rigidity in the longitudinal direction of the base material. In addition, the projection on the second surface of the base material is not required to be provided to correspond to each of the recesses provided in the first surface of the base material, and therefore it is not necessary to use the second mold including bumpers at positions corresponding to the punches for providing the recesses. Accordingly, it is possible to manufacture the carrier tape including the plurality of recesses at a narrow pitch without considering the thickness of the rib for separating the bumpers. Since the second mold is not required to include a bumper or a spring, it is possible to reduce the cost for the carrier tape manufacturing apparatus.

Furthermore, in accordance with a manufacturing method of the disclosure, the carrier tape is manufactured by providing the plurality of recesses in a first surface of the base material by compression using the punches included in the first mold, the recesses being for respectively containing the electronic components, and embedding the portion of the base material compressed by the punches into the groove included in the second mold. In this way, the projection is provided on the second surface of the base material along the longitudinal direction of the base material, the length of the projection being such that the projection extends over at least two of the recesses. Therefore, it is possible to provide the rib structure on the other surface of the base material, and to improve the tensile strength and the flexural rigidity in the longitudinal direction of the base material. In addition, the projection on the other surface of the base material is not required to be provided to correspond to each of the recesses provided in the one surface of the base material, and therefore it is not necessary to use the second mold including bumpers at positions corresponding to the punches for providing the recesses. Accordingly, it is possible to manufacture the carrier tape including the plurality of recesses at a narrow pitch without considering the thickness of the rib for separating the bumpers.

While exemplary embodiments have been described above, it is to be understood that variations and modifications will be apparent to those skilled in the art without departing from the scope and spirit of the disclosure. The scope of the invention, therefore, is to be determined solely by the following claims and their equivalents.

What is claimed is:

1. A carrier tape constituted by a strip-shaped base material, the tape comprising:
   a plurality of recesses provided in a first surface of the base material and for respectively containing electronic components;
   a covering unit configured to seal openings of the recesses; and
   a projection provided on a second surface of the base material along a longitudinal direction of the base material, a length of the projection being such that the projection extends over at least two of the recesses, the projection being provided at a position immediately under the recesses, wherein
   the first surface, the second surface and the projection are one piece and being the same material and the plurality of recesses and the projection are formed by a punch.

2. The carrier tape according to claim 1, wherein
   in a direction perpendicular to the longitudinal direction of the base material, a width of the projection is greater than that of the recesses.

3. The carrier tape according to claim 2, wherein
   a depth of the recesses is such that each recess reaches down to a position of the projection provided on the second surface of the base material.

4. The carrier tape according to claim 2, wherein
   the base material is made of paper.

5. The carrier tape according to claim 1, wherein
   the base material is made of paper.

6. A carrier tape constituted by a strip-shaped base material, the tape comprising:
   a plurality of recesses provided in a first surface of the base material and for respectively containing electronic components;
   a covering unit configured to seal openings of the recesses; and
   a projection formed of at least a portion of a second surface of the base material along a longitudinal direction of the base material, the projection being formed at a position immediately under the recesses, wherein
   the projection is provided from a first end of the base material along an entire length of the base material in the longitudinal direction to a second end of the base material.

7. The carrier tape according to claim 6, wherein
   in a direction perpendicular to the longitudinal direction of the base material, a width of the projection is greater than that of the recesses.

8. The carrier tape according to claim 7, wherein
   a depth of the recesses is such that each recess reaches down to a position of the projection provided on the second surface of the base material.

9. The carrier tape according to claim 7, wherein
   the base material is made of paper.

10. The carrier tape according to claim 6, wherein
    the base material is made of paper.

* * * * *